United States Patent
Lou

(10) Patent No.: US 8,183,661 B2
(45) Date of Patent: May 22, 2012

(54) SEMICONDUCTOR DIE WITH EVENT DETECTION FOR REDUCED POWER CONSUMPTION

(75) Inventor: Wenkwei Lou, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/092,078

(22) Filed: Apr. 21, 2011

(65) Prior Publication Data

US 2011/0193621 A1    Aug. 11, 2011

Related U.S. Application Data

(63) Continuation of application No. 11/897,338, filed on Aug. 29, 2007, now Pat. No. 7,944,016.

(51) Int. Cl.
*H01L 29/00* (2006.01)

(52) U.S. Cl. . 257/501; 257/499; 257/500; 257/E27.113; 257/E49.004; 257/E21.533

(58) Field of Classification Search ............... 257/499, 257/500, 501, E27.113, E49.004, E21.533
See application file for complete search history.

(56) References Cited

U.S. PATENT DOCUMENTS 4,329,773 A * 5/1982 Geipel et al. ............... 438/298
5,597,753 A * 1/1997 Sheu et al. .................. 438/275

* cited by examiner

*Primary Examiner* — Thanh V Pham
(74) *Attorney, Agent, or Firm* — Farjami & Farjami LLP

(57) ABSTRACT

According to one exemplary embodiment, a power managing semiconductor die with reduced power consumption includes a power island including an event detection block and an event qualification block. The event detection block is configured to activate the event qualification block in response to an input signal initiated by an external event. The input signal is coupled to the event detection block, for example, via a bond pad situated in an I/O region of the power managing semiconductor die. The event qualification block is configured to determine if the external event is a valid external event. The event qualification block resides in a thin oxide region and the event detection block resides in a thick oxide region of the semiconductor die. The power managing semiconductor die further includes a power management unit configured to activate the event qualification block in response to power enable signal outputted by the event detection block.

20 Claims, 5 Drawing Sheets

SEMICONDUCTOR DIE WITH EVENT DETECTION FOR REDUCED POWER CONSUMPTION

This is a continuation of application Ser. No. 11/897,338 filed Aug. 29, 2007, now U.S. Pat. No. 7,944,016.

BACKGROUND OF THE INVENTION

1. Field of the Invention

The present invention is generally in the field of semiconductor dies and circuits. More particularly, the invention is in the field of power management in semiconductor dies.

2. Background Art

Semiconductor device leakage current (e.g. transistor leakage current) can cause an undesirable increase in power consumption in semiconductor dies utilized in electronic devices such as battery powered devices, which include wireless communication devices, such as cell phones, and wireless human interface devices, such as wireless keyboards, mice, and game controllers. In an effort to reduce leakage current, a power management technique can be utilized whereby a power island of a semiconductor die is used to turn on the remaining regions of the die, and to turn off those remaining regions whenever the battery powered device is idle.

A conventional power island, which remains continuously activated (i.e. remains continuously powered on) in the idle mode of operation, can include a detection circuitry for detecting an external event, such as a depressed key on a wireless keyboard or a mouse movement, and a processing circuitry for event verification. The conventional power island is situated in a thick oxide region of the die, which includes semiconductor devices with thick gate oxide, and is utilized to turn on (or turn off) thin oxide regions of the die, which include semiconductor devices with thin gate oxide. Semiconductor devices in the thick oxide region of the die can have a higher threshold voltage than semiconductor devices in the thin oxide region, which reduces leakage current in the thick oxide region, i.e. the power island region of the die, that remains powered on during idle mode of operation.

However, as a result of the thick gate oxide, semiconductor devices in the thick oxide region of the die can have a significantly larger size than semiconductor devices in the thin oxide region. Thus, although the conventional power island reduces semiconductor device leakage, it (i.e. the conventional power island) also consumes a large area of the die, which can be particularly undesirable as devices are scaled down in advanced technologies.

SUMMARY OF THE INVENTION

A power managing semiconductor die with reduced power consumption as shown in and/or described in connection with at least one of the figures, as set forth more completely in the claims.

DETAILED DESCRIPTION OF THE INVENTION

The present invention is directed to a power managing semiconductor die with reduced power consumption. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
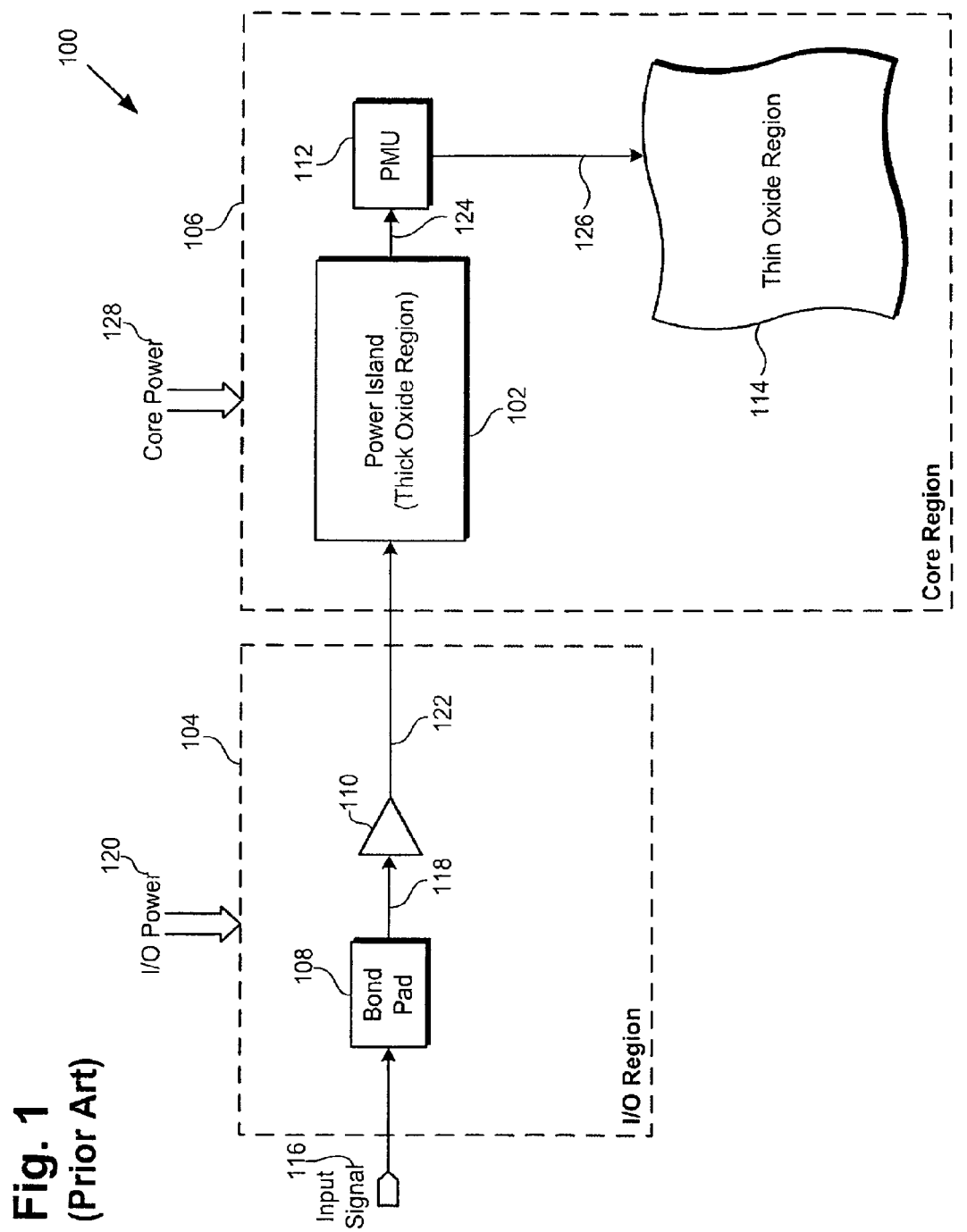
FIG. 1 is a block diagram of a conventional exemplary power managing semiconductor die including a conventional exemplary power island.

FIG. 1 shows a block diagram of conventional semiconductor die 100 with power management (also referred to hereinafter as "conventional power managing semiconductor die 100" or simply "conventional power managing die 100") including conventional power island 102. Conventional power managing die 100 includes I/O region 104 and core region 106. I/O region 104 includes bond pad 108 and input buffer 110 and core region 106 includes power island 102, power management unit (PMU) 112, and thin oxide region 114. Conventional power managing die 100 can be utilized in electronic devices such as battery powered devices, which include wireless communication devices, such as cell phones, and wireless human interface devices, such as wireless keyboards, mice, and game controllers.

As shown in FIG. 1, input signal 116 is coupled to the input of input buffer 110 via bond pad 108 and line 118 in I/O region 104 of conventional power managing die 100. Input signal 116 can be initiated by an external event occurring on an electronic device (not shown in FIG. 1) in which conventional power managing die 100 resides. If conventional power managing die 100 resides in, for example, a wireless keyboard, input signal 116 may be initiated by an external event such as pressing a key on the keyboard. As also shown in FIG. 1, power is provided to I/O region 104 by I/O power 120, which can be provide at a voltage of, for example, 1.8 volts, 3.3 volts, or 5.0 volts.

Further shown in FIG. 1, input signal 116 is coupled by input buffer 110 to the input of conventional power island 102 in core region 106 via line 122. Input buffer 110 can provide a high impedance at the input of the power island 102 so as to prevent current from being drawn from conventional power island 102 by an external device (not shown in FIG. 1) that is coupled to bond pad 108. Also shown in FIG. 1, the output of conventional power island 102 is coupled to the input of PMU 112 via line 124. Conventional power island 102 can include detection circuitry for detecting an input signal, e.g., input signal 116, on line 122 and processing circuitry for determining if the input signal originates from a valid external event, such as a key being pressed on a keyboard, or is a spurious signal, which may be generated by an erroneous external event such as, for example, a noise or a power spike. Conventional power island 102 can be configured to detect input signal 116 and output a power enable signal to PMU 112 after determining that input signal 116 originates from a valid external event. Conventional power island 102 resides in a thick oxide region of core region 106 in conventional power managing die 100, where the thick oxide region includes semiconductor devices with thick gate oxide. As a result of the thick gate oxide, the threshold voltage of semiconductor devices in conventional power island 102 can be increased, which reduces semiconductor device leakage current. However, the thick gate oxide also increases the size of the semiconductor devices, which correspondingly increases the amount of die area consumed by conventional power island 102.

Further shown in FIG. 1, the output of PMU 112 is coupled to thin oxide region 114 by line 126. PMU 112 can include, for example, a low dropout voltage regulator (LDO). PMU 112 can be configured to receive a power enable signal from power island 102 via line 124 and to provide core power, e.g., core Vdd, on line 126 so as to turn on thin oxide region 114. Thin oxide region 114 includes a remaining portion of core region 106 including semiconductor devices with a thin gate oxide and a low threshold voltage. Also shown in FIG. 1, power is supplied to core region 106 by core power 128, which can be provided at a lower voltage than I/O power 120.

By utilizing conventional power island 102, which is a thick oxide region of core region 106, conventional power managing die 100 provides reduced leakage current, which reduces power consumption. However, since conventional power island 102 is a thick oxide region, it (i.e. conventional power island 102) consumes a relatively large amount of area on the die. Also, as semiconductor device feature size is scaled down in advanced technologies, the leak current of the semiconductor devices in the die increases. Although the oxide thickness in conventional power island 102 can be further increased to accommodate a higher threshold voltage to reduce leakage, the increased oxide thickness further increases the amount of die area consumed by conventional power island 102. As a result, conventional power island 102 can an undesirable overall increase in die size.

Figure 2:
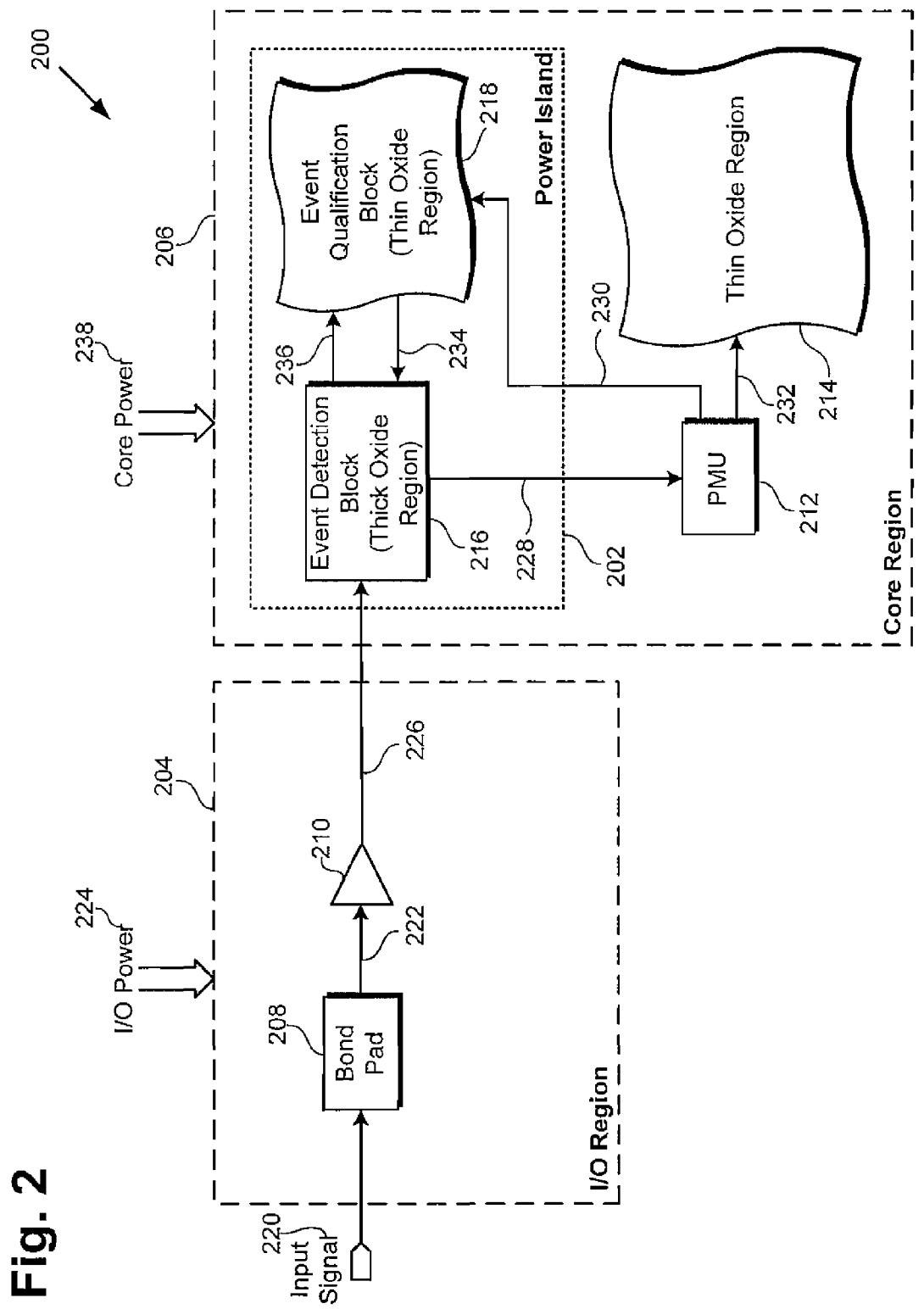
FIG. 2 is a block diagram of an exemplary power managing semiconductor die including an exemplary power island in accordance with one embodiment of the present invention.

FIG. 2 shows a block diagram of semiconductor die 200 with power management (also referred to hereinafter as "power managing semiconductor die 200" or simply "power managing die 200") including power island 202 in accordance with one embodiment of the present invention. Power managing die 200 includes I/O region 204 and core region 206. I/O region 204 includes bond pad 208 and input buffer 210 and core region 206 includes power island 202, PMU 212, and thin oxide region 214. Power island 202 includes event detection block 216 and event qualification block 218. Power managing die 200 can be utilized in electronic devices such as battery powered devices, which include wireless communication devices, such as cell phones, and wireless human interface devices, such as wireless keyboards, mice, and game controllers. The present invention can generally be applied to any electronic device to reduced leakage and, thereby, reduce power consumption. By reducing power consumption, the present invention can extend battery life in a battery powered device.

As shown in FIG. 2, input signal 220 is coupled to the input of input buffer 210 via bond pad 208 and line 222 in I/O region 204 of power managing die 200. Input signal 220 can be initiated by an external event occurring on an electronic device (not shown in FIG. 1) in which power managing die 200 resides or to which power managing die 200 is coupled. For example, input signal 220 may be initiated by an external event such as pressing a key on a wireless keyboard, a wireless mouse movement, or pressing a pad on a portable music player. Also shown in FIG. 2, power is provided to I/O region 204 by I/O power 224, which can be provided at a voltage of, for example, 1.8 volts, 3.3 volts, or 5.0 volts.

Further shown in FIG. 2, input signal 220 is coupled by input buffer 210 to the input of event detection block 216 in power island 202 by line 226. In the embodiment of the invention in FIG. 1, event detection block 216 is situated in a thick oxide region in core region 206 of power managing die 200. Input buffer 210 can provide a high impedance at the input of event detection block 216 so as to prevent current from being drawn from it (i.e. event detection block 216) by an external device (not shown in FIG. 2) that is coupled to bond pad 208. Also shown in FIG. 2, an output of event detection block 216 is coupled to the input of PMU 212 via line 228. Event detection block 216 resides in a thick oxide region, which, in the embodiment of the invention in FIG. 2, is situated in core region 206 of power managing die 200. As a result of being in a thick oxide region, the semiconductor devices in event detection block 216, which is always activated, i.e., always turned on, have a high threshold voltage, which reduces semiconductor device leakage current.

Event detection block 216 can be configured to detect an input signal, such as input signal 220, on line 226, and to provide a power enable signal on line 228 to activate, i.e., to turn on, PMU 212. The input signal detected by event detection block 216 may or may not be initiated by a valid external event. However, event detection block 216 only detects an input signal on line 226; it (i.e. event detection block 216) does determine if the input signal originates from a valid external event. Event detection block 216 can detect an input signal by, for example, sensing the occurrence of a falling edge, i.e., an abrupt change in voltage, on line 226. Further shown in FIG. 2, the outputs of PMU 212 are coupled to event qualification block 218 and thin oxide region 214 via respective lines 230 and 232. PMU 212 can include, for example, an LDO (low dropout voltage regulator).

PMU 212 can be configured to receive a power enable signal from event detection block 216 via line 228 and to provide core power, e.g., core Vdd, to event qualification block 218 via line 230 and to provide core power to thin oxide region 214. Event qualification block 218 and thin oxide region 214 are activated by receiving core power from PMU 212. Thus, event qualification block 218 and thin oxide region 214, which are normally deactivated, i.e., turned off, are activated by PMU 212 in response to the power enable signal provided to PMU 212 by event detection block 216.

Also shown in FIG. 2, event qualification block 218 is coupled to PMU 212 via line 230 and coupled to event qualification block 216 via lines 234 and 236. Event qualification block 218 resides in a thin oxide region in core region 206 of power managing die 200. Since event qualification block 218 resides in a thin oxide region, the semiconductor devices in event qualification block 216 have a thin gate oxide and a low threshold voltage, which can increase semiconductor device leakage current. However, event qualification block 218 is only activated by PMU 212 in response to a power enable signal provided by event detection block 216. PMU 212 can be powered by core power 238, which provides power to core region 206. Core power 238 is typically provided at a lower voltage than I/O power 224.

Once activated by receiving core power from PMU 212 via line 230, event qualification block 216 can be configured to determine if the input signal detected by event detection block 216 originates from a valid external event, such as a key being pressed on a keyboard, or is a spurious signal, which may be generated by an erroneous external event such as, for example, a noise or a power spike. Event qualification block 218 can determine the validity of the input signal detected by event detection block 216 by communicating with event detection block 216 via lines 234 and 236 after being activated. Event qualification block 218 can comprise processing circuitry for performing, for example, debouncing procedures as well as other types of event qualification procedures. As a result of the processing performed by event qualification block 218, it can include significantly more logic circuitry compared to event detection block 216, which is utilized only for detecting an input signal on line 226. Consequently, event qualification block 218 can be significantly larger in size, i.e., it can consume significantly more die area, compared to event detection block 216.

Thin oxide region 214 can include a remaining portion of core region 206, which can include, for example, a processor. Thin oxide region 214 includes semiconductor devices that have a thin gate oxide and a low threshold voltage, which can increase leakage current. However, thin oxide region 214 can remain turned off until it is activated by PMU 212 in response to the power enable signal provided by event detection block 216.

Thus, in the embodiment of the present invention in FIG. 2, power island 202 is divided into event detection block 216, which resides in a thick oxide region, and event qualification block 218, which resides in a thin oxide region. However, event qualification block 218 is only activated when event detection block 216 detects an input signal on line 226. In contrast, conventional power island 102 in conventional power managing die 100, which performs similar event detection and event qualification functions as power island 202, is always activated. Thus, by dividing power island 202 into two blocks, i.e., event detection block 216 and event qualification block 218, such that only one block, i.e., event detection block 216, is always activated, the invention's power island provides reduced leakage current and consumes less power compared to conventional power island 102. Also, since only a portion of power island 202, i.e., event detection block 216, resides in a thick oxide region, power island 202 consumes less die area than conventional power island 102, which resides entirely in a thick oxide region.

Thus, by dividing a power island into an event detection block, which resides in a thick oxide region, and an event qualification block, which resides in a thick oxide region, where the event qualification block remains turned off until activated by the event detect block, the embodiment of the invention in FIG. 2 advantageously provides a power managing semiconductor die with reduced power consumption and a power island with reduced die area consumption. By reducing the die area consumed by the power island, the embodiment of the invention in FIG. 2 can also provide a power managing semiconductor die with reduced die size.

Figure 3:
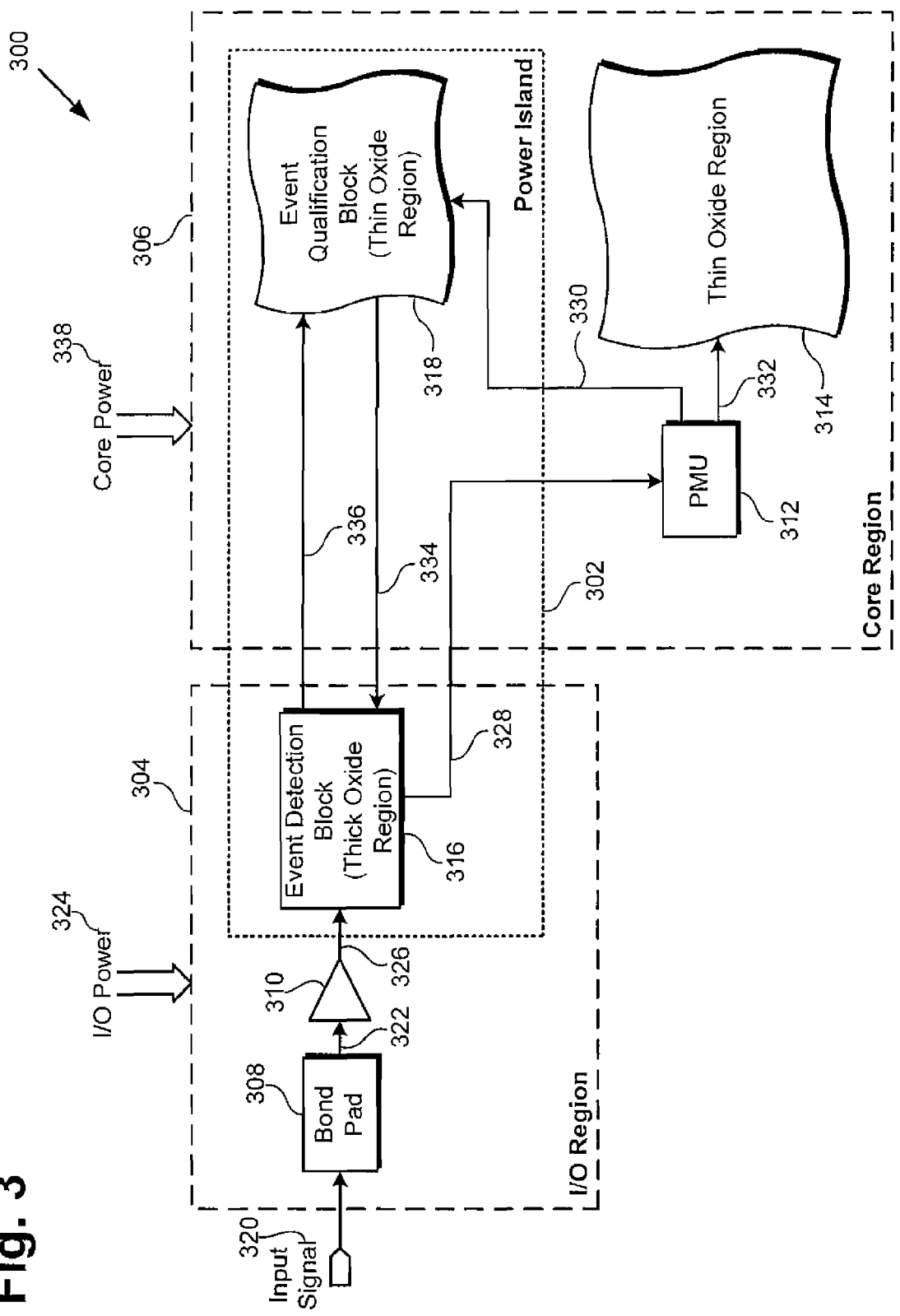
FIG. 3 is a block diagram of an exemplary power managing semiconductor die including an exemplary power island in accordance with one embodiment of the present invention.

FIG. 3 shows a block diagram of semiconductor die 300 with power management (also referred to as hereinafter as "power managing semiconductor die 300" or simply "power managing die 300") including power island 302 in accordance with one embodiment of the present invention. In FIG. 3, bond pad 308, input buffer 310, PMU 312, thin oxide region 314, event qualification block 318, input signal 320, lines 322, 326, 328, 330 332, 334, and 336, I/0 power 324, and core power 338 correspond, respectively, to bond pad 208, input buffer 210, PMU 212, thin oxide region 214, event qualification block 218, input signal 220, lines 222, 226, 228, 230 232, 234, and 236, I/O power 224, and core power 238 in FIG. 2. Power managing die 300 can be utilized in similar electronic devices as power managing die 200 discussed above. To preserve brevity, only the differences between power managing die 300 and power managing die 200 will be discussed herein.

As shown in FIG. 3, event detection block 316, which performs the same functions as event detection block 216 discussed above, reside in a thick oxide region in I/O region 304 of power managing die 300. As a result, event detection block 316 is powered by I/O power 324, whereas event detection block 216 in FIG. 2 resides in a thick oxide region in core region 206 of power managing die 200 and is powered by core power 238. In the embodiment of the invention in FIG. 3, power island 302 includes event detection block 316, which resides in I/O region 304, and event qualification block 318, which resides in core region 306. Thus, in the embodiment of the invention in FIG. 3, event detection block 316 is powered by I/O power 324, and, therefore, does not require core power. Therefore, in the embodiment of the invention in FIG. 3, the core power is not utilized at all until PMU 312 is activated by a power enable signal from event detection block 316 via line 328.

Also, lines 328, 334, and 336 in the embodiment in FIG. 3 extend from I/O region 304 to core region 306, whereas corresponding lines 228, 234, and 236 in the embodiment in FIG. 2 reside only in core region 206. In addition, line 326 in the embodiment in FIG. 3 resides in I/O region 304, whereas corresponding line 226 in the embodiment in FIG. 2 extends between I/O region 204 and core region 206. The embodiment of the invention in FIG. 3 also provides similar advantages as discussed above in relation to the embodiment of the invention in FIG. 2.

Figure 4:
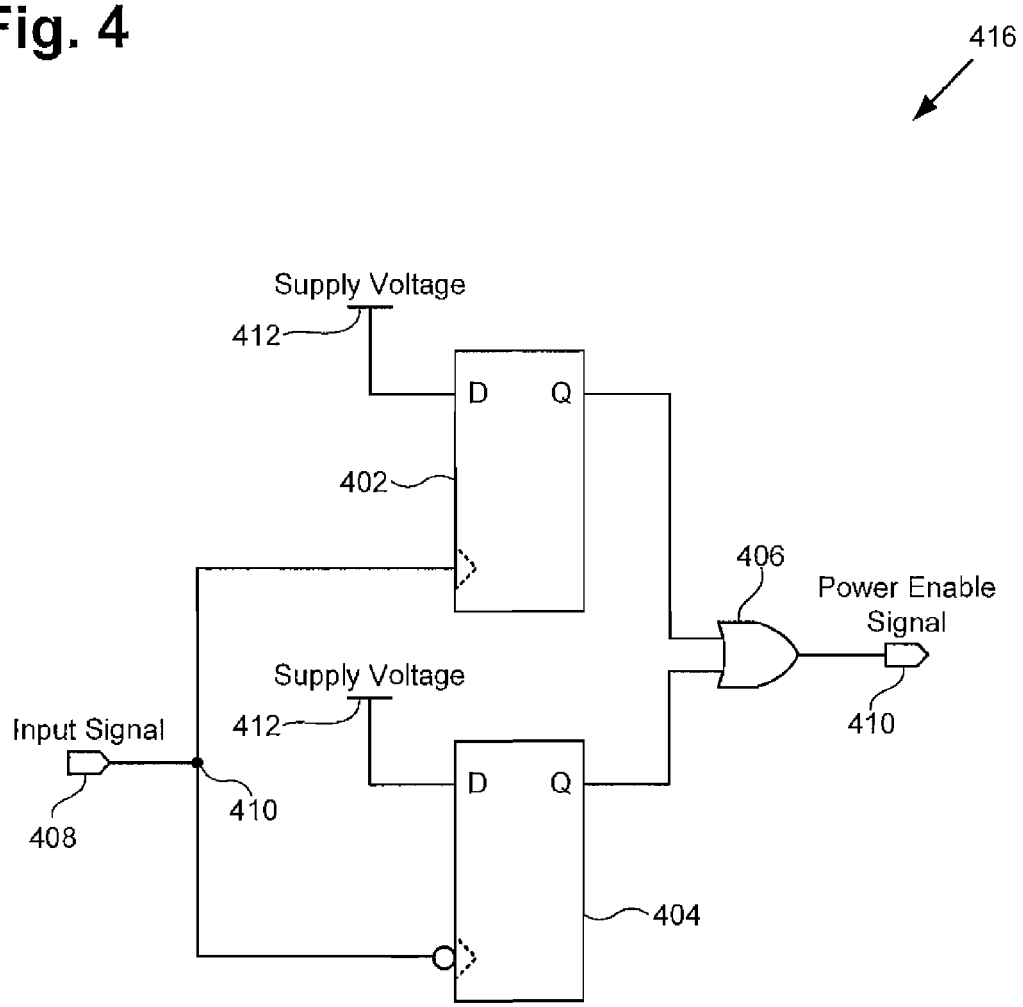
FIG. 4 illustrates a circuit diagram of an exemplary event detect block in accordance with one embodiment of the present invention.

FIG. 4 shows a schematic diagram of event detection block 416 in accordance with one embodiment of the present invention. Event detection block 416 in FIG. 4 corresponds to event detection block 316 in FIG. 3. In one embodiment of the invention, event detection block 416 can correspond to event detection block 216 in FIG. 2. Event detection block 416 includes flip-flops 402 and 404 and OR gate 406. Event detection block 416 can be configured to detect input signal 408 and provide power enable signal 410. Event detection block 416 can reside in a thick oxide region in I/O region 304 in FIG. 3.

As shown in FIG. 4, input signal 408 is coupled to a clock input of flip-flop 402 and an inverted clock input of flip-flop 404 at node 410. Flip-flops 404 and 404 can be, for example, D flip-flops. Input signal 408 can be, for example, a signal that is initiated by an external event and coupled to a bond pad, such bond pad 308, of a power managing die, such as power managing die 300 in FIG. 3. Also shown in FIG. 4, the D inputs of flip-flops 402 and 404 are coupled to supply voltage 412, which can be provided by I/O power, such as I/O power 324 in FIG. 3. In one embodiment, supply voltage 412 may be provided by core power, such as core power 238 in FIG. 2. Further shown in FIG. 4, the Q outputs of flip-flops 402 and 404 are coupled to respective inputs of OR gate 406. OR gate 406 can provide power enable signal 410 when either one of its inputs is high, i.e., equal to a logic "1."

During operation, flip-flop 402 can detect a rising edge of input signal 408 and flip-flop 404 can detect a falling edge of input signal 408. Thus, either a falling edge or a rising edge of an input signal, such as input signal 408, can trigger event detection block 416 and, thereby, cause the event detection block to output power enable signal 410. In the embodiment of the invention in FIG. 3, power enable signal 410 can be provided on line 328 to turn on PMU 312 and, thereby, cause event qualification block 318 and thin oxide region 314 in core region 306 of power managing die 300 to be activated. In other embodiments, event detection block 416 may comprise a single flip-flop or a different combination of logic devices.

Figure 5:
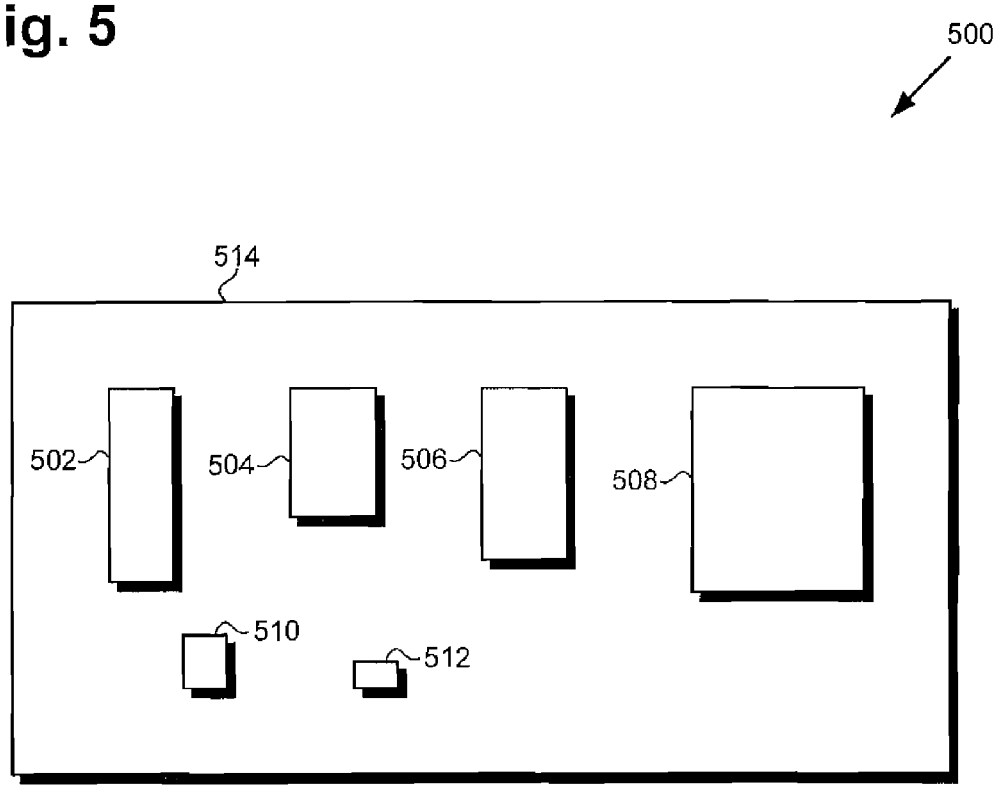
FIG. 5 is a diagram of an exemplary electronic system including an exemplary power managing semiconductor die in accordance with one embodiment of the present invention.

FIG. 5 illustrates a diagram of an exemplary electronic system including an exemplary chip or die in accordance with one embodiment of the present invention. Electronic system 500 includes exemplary modules 502, 504, and 506, IC ("Integrated Circuit") chip 508, discrete components 510 and 512, residing in and interconnected through circuit board 514. In one embodiment, electronic system 500 may include more than one circuit board. IC chip 508 can comprise one of the invention's semiconductor dies, such as power managing semiconductor die 200 in FIG. 2 or power managing semiconductor die 300 in FIG. 3, as described above.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is surface mounted on circuit board 514 and comprises an embodiment of the invention's power managing semiconductor die. In one embodiment, IC chip 508 may be mounted on a substrate in a semiconductor package, which can be in turn mounted on circuit board 514. In another embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired or wireless communications device, a wireless human interface device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, as discussed above, by dividing a power island into an event detection block, which resides in a thick oxide region, and an event qualification block, which resides in a thin oxide region, where the event qualification block remains turned off until activated by the event detection block, embodiments of the present invention in FIGS. 2 and 3 provide a power managing semiconductor die with reduced power consumption. Also, by dividing the power island into an event detection block, which resides in a thick oxide region, and an event qualification block, which resides in a thin oxide region, embodiments of the present invention in FIGS. 2 and 3 can reduce the die area consumed by the power island, which can result in a reduction in the size of the power managing semiconductor die.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a power managing semiconductor die with reduced power consumption has been described.

The invention claimed is:

1. A power managing semiconductor die with reduced power consumption, said power managing semiconductor die comprising:
    a power island comprising an event detection block and an event qualification block;
    said event qualification block activated by a power enable signal outputted by said event detection block in response to an input signal initiated by an external event.

2. The power managing semiconductor die of claim 1, wherein said event qualification block resides in a thin oxide region of said semiconductor die.

3. The power managing semiconductor die of claim 1, wherein said event detection block resides in a thick oxide region of said semiconductor die.

4. The power managing semiconductor die of claim 1, wherein said event qualification block resides in a thin oxide region and said event detection block resides in a thick oxide region of said semiconductor die.

5. The power managing semiconductor die of claim 1, wherein said event qualification block is configured to determine if said external event is a valid external event.

6. The power managing semiconductor die of claim 1, wherein said event detection block is situated in a core region of said power managing semiconductor die.

7. The power managing semiconductor die of claim 1, wherein said event detection block is situated in an I/O region of said power managing semiconductor die.

8. The power managing semiconductor die of claim 1, wherein said input signal is coupled to said event detection block via a bond pad situation in an I/O region of said power managing semiconductor die.

9. The power managing semiconductor die of claim 1, wherein said event detection block comprises at least one flip-flop configured to detect said input signal.

10. The power managing semiconductor die of claim 1, wherein said power managing semiconductor die is situated in an electronic device selected from the group consisting of a wireless communication device and a wireless human interface device.

11. A power managing semiconductor die with reduced power consumption, said power managing semiconductor die comprising:
    a power island comprising an event detection block and an event qualification block, said event detection block being situated in an I/O region of said power managing semiconductor die;
    said event qualification block activated by a power enable signal outputted by said event detection block in response to an input signal initiated by an external event.

12. The power managing semiconductor die of claim 11, wherein said event qualification block is configured to determine if said external event is a valid external event.

13. The power managing semiconductor die of claim 11, wherein said input signal is coupled to said event detection block via a bond pad situation in said I/O region of said power managing semiconductor die.

14. The power managing semiconductor die of claim 11, wherein said event detection block comprises at least one flip-flop configured to detect said input signal.

15. The power managing semiconductor die of claim 11, wherein said power managing semiconductor die is situated in an electronic device selected from the group consisting of a wireless communication device and a wireless human interface device.

16. An electronic system comprising a power managing semiconductor die with reduced power consumption, said power managing semiconductor die comprising:
   a power island comprising an event detection block and an event qualification block;
   said event qualification block activated by a power enable signal outputted by said event detection block in response to an input signal initiated by an external event, wherein said event qualification block is configured to determine if said external event is a valid external event.

17. The electronic system of claim 16, wherein said event qualification block resides in a thin oxide region of said semiconductor die.

18. The electronic system of claim 16, wherein said event detection block resides in a thick oxide region of said semiconductor die.

19. The electronic system of claim 16, wherein said power managing semiconductor die further comprises a power management unit configured to activate said event qualification block in response to said power enable signal outputted by said event detection block.

20. The electronic system of claim 16, wherein said electronic system is selected from the group consisting of a wired or wireless communications device, a wireless human interface device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, and a digitally-controlled medical equipment.

* * * * *